(12) United States Patent
Wen

(10) Patent No.: US 11,158,530 B1
(45) Date of Patent: Oct. 26, 2021

(54) MATERIALS RACK

(71) Applicant: TRIPLE WIN TECHNOLOGY(SHENZHEN) CO. LTD., Shenzhen (CN)

(72) Inventor: Yuan Wen, Shenzhen (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 17/151,556

(22) Filed: Jan. 18, 2021

(30) Foreign Application Priority Data

Jun. 1, 2020 (CN) .......................... 202020969817.0

(51) Int. Cl.
*H01L 21/673* (2006.01)
*B25H 3/04* (2006.01)

(52) U.S. Cl.
CPC ...... *H01L 21/6732* (2013.01); *H01L 21/6734* (2013.01); *B25H 3/04* (2013.01)

(58) Field of Classification Search
CPC . H01L 21/6734; H01L 21/6732; B65D 85/48; B25H 3/04
See application file for complete search history.

(56) References Cited

U.S. PATENT DOCUMENTS

| | | | | |
|---|---|---|---|---|
| 4,964,810 A * | 10/1990 | Malotke | ............... | H05K 7/1408 361/801 |
| 5,853,214 A * | 12/1998 | Babbs | ................ | H01L 21/6734 294/161 |
| 7,086,540 B2 * | 8/2006 | Huang | ................ | H01L 21/6734 211/183 |
| 7,891,937 B2 * | 2/2011 | Mohamed | ........... | H01L 21/6732 414/810 |
| 7,931,145 B2 * | 4/2011 | Gao | .................... | H05K 13/0061 206/454 |
| 8,905,239 B2 * | 12/2014 | Kim | .................... | H01L 21/6732 206/711 |
| 9,605,797 B2 * | 3/2017 | Han | .................... | H01L 21/67373 |
| 10,793,338 B2 * | 10/2020 | Heap | ..................... | B65D 81/18 |
| 2003/0132176 A1 * | 7/2003 | Takano | ............. | H01L 21/67309 211/41.1 |
| 2004/0108284 A1 * | 6/2004 | Huang | ................ | H01L 21/6734 211/41.18 |
| 2014/0231370 A1 * | 8/2014 | Han | .................... | H01L 21/6734 211/41.1 |

* cited by examiner

*Primary Examiner* — Kimberley S Wright

(74) *Attorney, Agent, or Firm* — ScienBiziP, P.C.

(57) ABSTRACT

A materials rack carrying support plates inside, and able to secure or release the support plates by lifting or dropping a handle at the top, includes a frame, a stop assembly, and an assembly for the handle. The stop assembly includes a stop rod, a first pressing plate on an end of the stop rod, and an elastic member resisting against the top frame and the first pressing plate. The handle assembly includes a rotating shaft, the handle and a second pressing plate being fixed to the rotating shaft. By the handle, the second pressing plate can be moved towards the first pressing plate to press down the first pressing plate or moved away from the first pressing plate to release a downward pressure of the first pressing plate.

10 Claims, 2 Drawing Sheets

MATERIALS RACK

FIELD

The subject matter herein generally relates to materials handling.

BACKGROUND

When transporting a general materials rack with a support plate, the support plate may fall out. A locking rod may be positioned on the materials rack to prevent the support plate from falling during transporting. However, the locking rod may need to be manually locked before transporting, and may need to be manually unlocked before loading or unloading materials.

BRIEF DESCRIPTION OF THE DRAWINGS

Implementations of the present technology will now be described, by way of embodiment, with reference to the attached figures.

DETAILED DESCRIPTION

Figure 1:
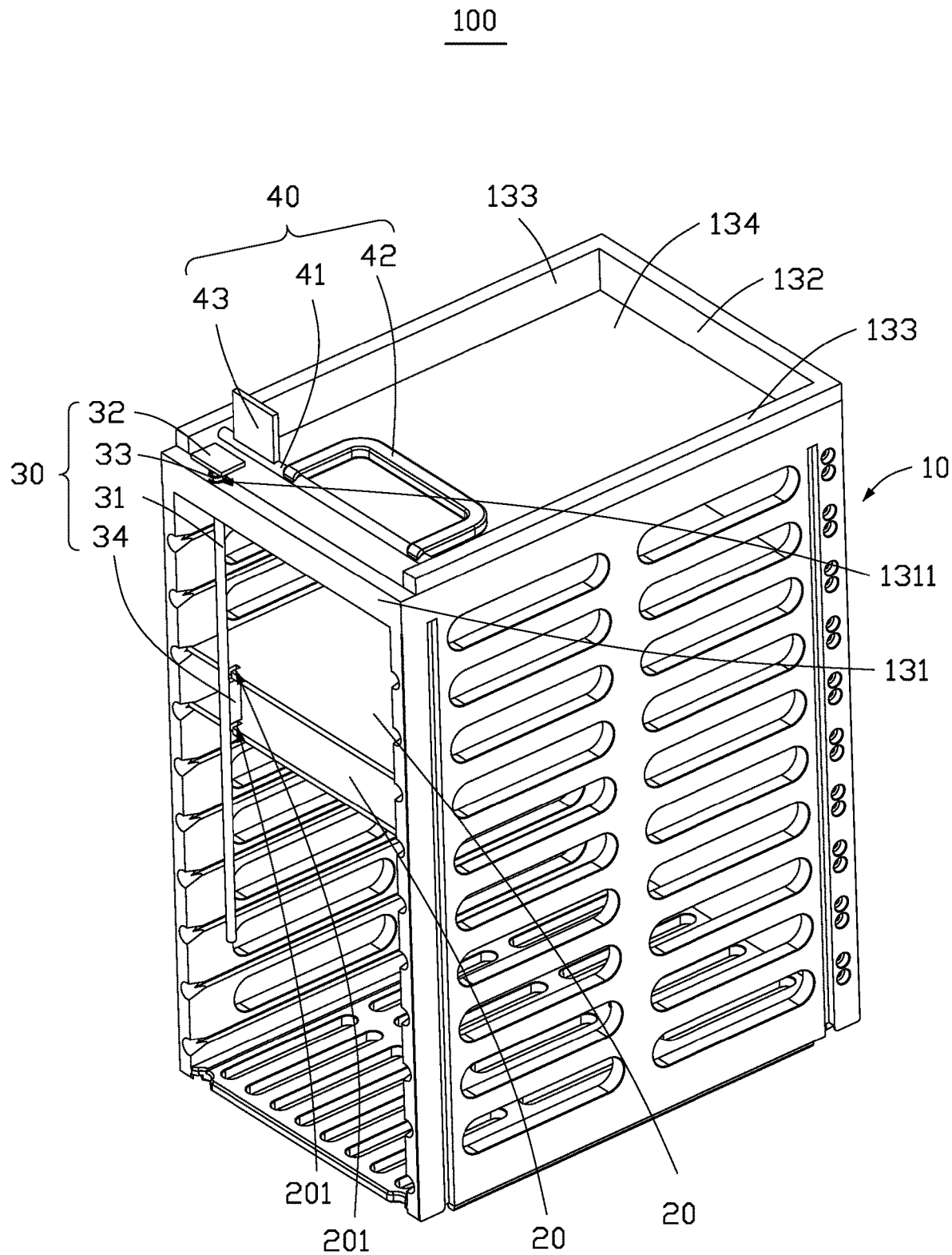
FIG. 1 is an isometric view of a materials rack in a first state in accordance with one embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

FIG. 1 is a schematic view of an embodiment of a materials rack (materials rack 100) including a frame 10, at least one support plate 20, a stop assembly 30, and a handle assembly 40.

Figure 2:
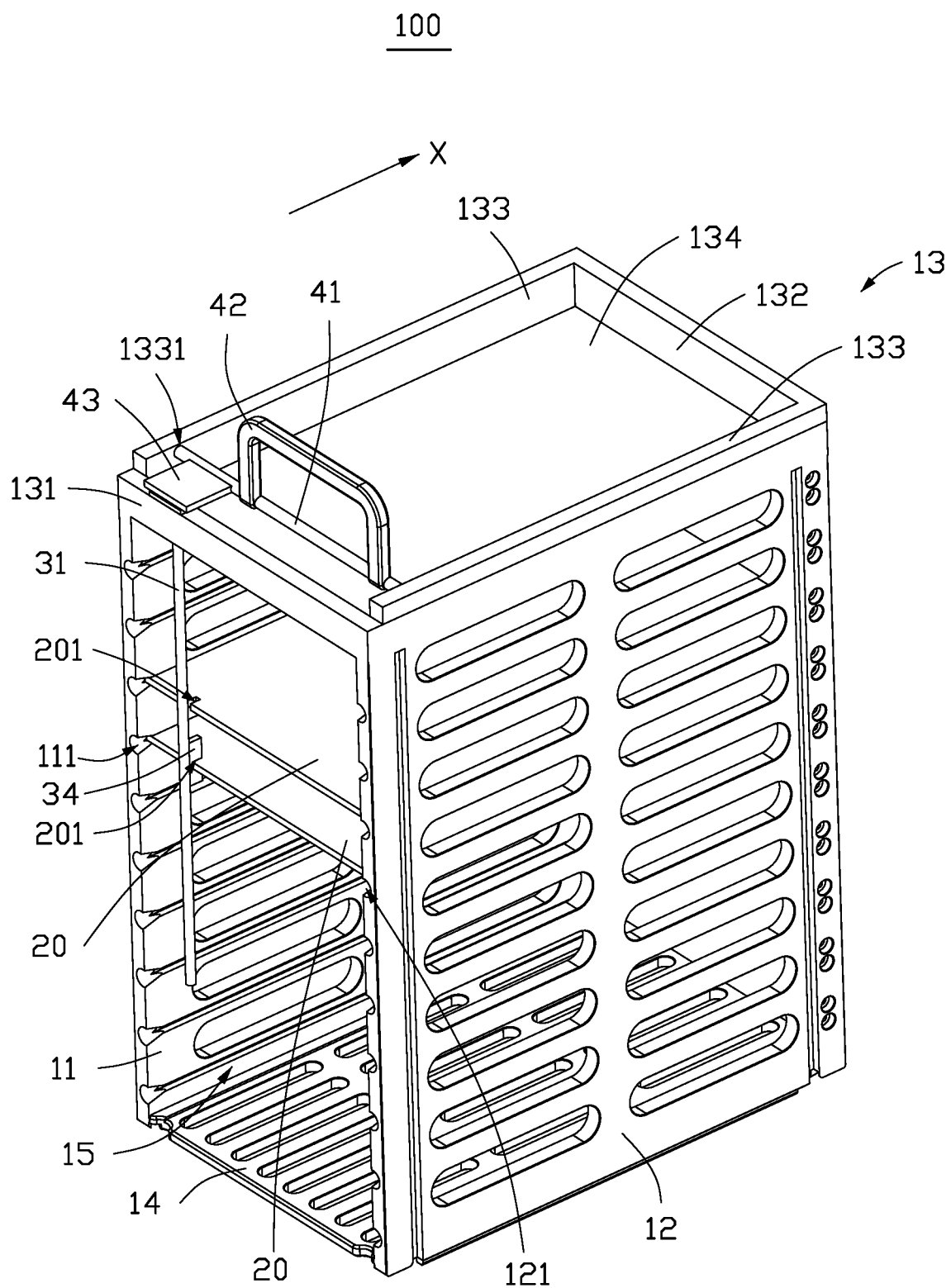
FIG. 2 shows the materials rack in a second state.

As shown in FIGS. 1 and 2, the frame 10 includes a first side frame 11, a second side frame 12, a top frame 13, and a bottom frame 14. The first side frame 11 and the second side frame 12 are opposite to each other, and the top frame 13 and the bottom frame 14 are opposite to each other. The first side frame 11 and the second side frame 12 each connects with the top frame 13 and the bottom frame 14 to form a receiving space 15. The at least one support plate 20 is accommodated in the receiving space 15 and disposed between the first side frame 11 and the second side frame 12. The first side frame 11, the second side frame 12, the top frame 13, and the bottom frame 14 are each substantially rectangular. In an alternative embodiment, the first side frame 11, the second side frame 12, the top frame 13, and the bottom frame 14 may be substantially circular or other shape.

As shown in FIG. 2, the first side frame 11 includes a plurality of first slots 111 defined on a surface facing the second side frame 12. Each of the first slots 111 extends along a length direction of the frame 10 (the X-axis direction). The second side frame 12 includes a plurality of second slots 121 defined on a surface facing the first side frame 11. The second slots 121 are correspondingly positioned to match the first slots 111. Two ends of a support plate 20 can be inserted into one of the first slots 111 and a corresponding one of the second slots 121 at the same time, and can slide in the first slot 111 and the second slot 121 along the X-axis direction, thereby the support plate 20 is accommodated in the receiving space 15. In the embodiment, the first slots 111 are parallel to each other.

The number of the first slots 111 on the first side frame 11 is enough to accommodate any number of support plates 20.

The support plate 20 is configured to carry materials. In an alternative embodiment, the materials rack 100 includes two support plates 20. The support plates 20 are substantially rectangular. The number of the support plates 20 is according to needs, such as be three, four, five, etc. The support plate 20 is not limited to being rectangular, the shape of the support plate 20 is not limited.

As shown in FIG. 1, the stop assembly 30 includes a stop rod 31, a first pressing plate 32, and an elastic member 33.

As shown in FIG. 2, the stop rod 31 extends through the top frame 13 and is located on a side of the support plate 20. The stop rod 31 blocks and locates the support plate 20, to prevent the support plate 20 from slipping out of the receiving space 15.

As shown in FIGS. 1 and 2, the top frame 13 includes a first connecting rod 131, a second connecting rod 132 opposite to the first connecting rod 131, and two third connecting rods 133 opposite to each other. Each of the first connecting rod 131 and the second connecting rod 132 connects with the two third connecting rods 133 to form the top frame 13. The first connecting rod 131 defines a through hole 1311 which penetrates the first connecting rod 131 along a direction extending from the top frame 13 towards the bottom frame 14. The stop rod 31 extends through the through hole 1311 and can move toward or away from the bottom frame 14. In other words, the stop rod 31 is partially and movably received in the through hole 1311.

As shown in FIG. 2, the first pressing plate 32 is disposed on an end of the stop rod 31 and located on a side of the top frame 13 away from the bottom frame 14. An angle between an extending direction of the first pressing plate 32 and an extending direction of the first connecting rod 131 is about 0 degree.

As shown in FIGS. 1 and 2, the elastic member 33 is sleeved on the stop rod 31 and resists against the first connecting rod 131 and the first pressing plate 32. In an alternative embodiment, the elastic member 33 is a spring. The elastic member 33 supports the first pressing plate 32.

As shown in FIG. 1, the stop assembly 30 further includes at least one latching plate 34. The latching plate 34 is disposed on the stop rod 31. The support plate 20 defines a latching groove 201 matching with the latching plate 34. The latching plate 34 is movably latched in the latching groove 201. In one embodiment, there is an equal number of latching plates 34 and support plates 20.

As shown in FIG. 1, when the first pressing plate 32 is not subjected to a downward pressure, the latching plate 34 is located between two adjacent support plates 20. In one embodiment, a vertical distance between the latching plate 34 and one of two adjacent support plates 20 adjacent to the bottom plate 20 is about 2 mm to 5 mm.

As shown in FIG. 2, when the first pressing plate 32 is subjected to the downward pressure, the first pressing plate 32 moves towards the bottom frame 14, the elastic member 33 is compressed by the first pressing plate 32, and the latching plate 34 on the stop rod 31 moves toward the bottom frame 14 and is latched in the latching groove 201. This locates and fastens the support plate 20, thereby preventing the support plate 20 from sliding out of the receiving space 15.

As shown in FIG. 1, the handle assembly 40 includes a rotating shaft 41, a handle 42, and a second pressing plate 43.

As shown in FIG. 2, the rotating shaft 41 is rotatably connected to the top frame 13. Each of the third connecting rods 133 defines a connecting hole 1331. The two connecting holes 1331 of the two third connecting rods 133 are opposite to each other. Two ends of the rotating shaft 41 are rotatably connected in the connecting holes 1331 of the two third connecting rods 133, so that the rotating shaft 41 can rotate relative to the top frame 13.

As shown in FIGS. 1 and 2, the handle 42 and the second pressing plate 43 are fixed to the rotating shaft 41, so that the second pressing plate 43 can be driven by the handle 42. An angle between an extending direction of the handle 42 and an extending direction of the second pressing plate 43 is about 90 degrees. The second pressing plate 43 is driven to move towards the first pressing plate 32 to press down the first pressing plate 32. In reverse, it can be moved away from the first pressing plate 32 to release the first pressing plate 32.

The handle 42 is substantially U-shaped. The top frame 13 further includes a top plate 134. The top plate 134 supports the handle 42. The top plate 134 connects with the first connecting rod 131, the second connecting rod 132, and the two third connecting rods 133. The handle assembly 40 is located above the top plate 134. Gravity makes the handle 42 automatically fall to the top plate 134 when not in use.

As shown in FIG. 1, when the materials rack 100 is not used for transporting materials, that is, when the first pressing plate 32 is not subjected to the action of the second pressing plate 43, the latching plate 34 is located between two adjacent support plates 20, and the handle 42 rests on the top plate 134 under its own gravity.

As shown in FIG. 2, when the materials rack 100 is used for transporting materials, a user (whether a person or a machine) can grab and rotate the handle 42 until the handle 42 is perpendicular to the top plate 134, to lift the materials rack 100. In the process of grasping and rotating the handle 42, the rotating shaft 41 rotates under the action of the handle 42, thereby driving the second pressing plate 43 to move toward the first pressing plate 32. When the second pressing plate 43 touches the first pressing plate 32, with the rotation of the rotating shaft 41, the second pressing plate 43 pushes the first pressing plate 32 to move down, the elastic member 33 is compressed by the first pressing plate 32, and the latching plate 34 on the stop rod 31 moves towards the bottom frame 14 until the latching plate 34 is latched in the latching groove 201. The support plate 20 is thereby fastened, preventing the support plate 20 from falling off during the transportation of the materials rack 100. In the materials rack 100, the stop assembly 30 and the handle assembly 40 cooperate with each other, so that when the handle 42 is lifted, the support plate 20 is automatically locked by the stop assembly 30.

As shown in FIGS. 1 and 2, when the materials in the materials rack 100 needs to be unloaded, the handle 42 is released, and the handle 42 falls to the top plate 134. The second pressing plate 43 is driven away from the first pressing plate 32 to release the first pressing plate 32. When the second pressing plate 43 is separated from the first pressing plate 32, the first pressing plate 32 returns to the initial position under the elastic restoring force of the elastic member 33 and drives the latching plate 34 on the stop rod 31 to move towards the top frame 13 until the latching plate 34 is separated from the latching groove 201, so that the support plate 20 is unlocked. In the materials rack 100, the stop assembly 30 and the handle assembly 40 cooperate with each other, so that when the handle 42 is down, the support plate 20 is automatically unlocked.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A materials rack comprising:
   at least one support plate;
   a frame comprising a first side frame, a second side frame opposite to the first side frame, a top frame, and a bottom frame opposite to the top frame, each of the first side frame and the second side frame connecting with the top frame and the bottom frame to from a receiving space, wherein the at least one support plate is accommodated in the receiving space and disposed between the first side frame and the second side frame;
   a top assembly comprising:
      a stop rod extending through the top frame and located on a side of the support plate,
      a first pressing plate disposed on an end of the stop rod and located on a side of the top frame away from the bottom frame, and
      an elastic member sleeved on the stop rod and resisting against the top frame and the first pressing plate; and
   a handle assembly comprising:
      a rotating shaft rotatably coupled to the top frame,
      a handle fixed to the rotating shaft, and
      a second pressing plate fixed to the rotating shaft,
   wherein when the rotating shaft is rotated by the handle, the second pressing plate is moved towards the first pressing plate to press down the first pressing plate or moved away from the first pressing plate to release the first pressing plate.

2. The materials rack of claim 1, comprises a plurality of the support plates, wherein the stop assembly further comprises a latching plate, the latching plate is disposed on the stop rod and is located between two adjacent support plates, each of the support plates defines a latching groove, the latching plate is movably latched in the latching groove.

3. The materials rack of claim 2, wherein a vertical distance between the latching plate and one of the two adjacent support plates adjacent to the bottom plate is about 2 mm to 5 mm.

4. The materials rack of claim 1, wherein an angle between an extending direction of the second pressing plate and an extending direction of the handle is 90 degrees.

5. The materials rack of claim 1, wherein the top frame comprises a first connecting rod, a second connecting rod opposite to the first connecting rod, and two third connecting rods opposite to each other, each of the first connecting rod and the second connecting rod connects the two third connecting rods, the first connecting rod defines a through hole which penetrates the first connecting rod along a direction extending from the top frame towards the bottom frame, the stop rod extends through the through hole, the elastic member resists against the first connecting rod and the first pressing plate.

6. The materials rack of claim 5, wherein each of the two third connecting rods defines a connecting hole, two ends of the rotating shaft are rotatably coupled in the connecting holes of the two third connecting rods respectively.

7. The materials rack of claim 5, wherein the top frame further comprises a top plate connecting the first connecting rod, the second connecting rod, and the two third connecting rods, the handle assembly is located above the top plate.

8. The materials rack of claim 1, wherein the elastic member is a spring.

9. The materials rack of claim 1, wherein the first side frame comprises a plurality of first slots defined on a surface facing the second side frame, the second side frame comprises a plurality of second slots defined on a surface facing the first side frame, the plurality of second slots is correspondingly positioned to match the plurality of first slots, the materials rack comprises a plurality of the support plates, each of the support plates is inserted into one of the plurality of first slots and a corresponding one of the plurality of second slots.

10. The materials rack of claim 9, wherein each of the plurality of first slots extends along a length direction of the frame, the plurality of first slots are parallel to each other.

* * * * *